US009541580B2

(12) United States Patent
Nodera et al.

(10) Patent No.: US 9,541,580 B2
(45) Date of Patent: Jan. 10, 2017

(54) CURRENT DETECTING DEVICE

(71) Applicant: Fuji Electric FA Components & Systems Co., Ltd., Tokyo (JP)

(72) Inventors: Toshio Nodera, Tochigi (JP); Yasuhiro Takahashi, Kounosu (JP); Takashi Hashimoto, Ohtawara (JP); Yohei Hosooka, Ohtawara (JP)

(73) Assignee: FUJI ELECTRIC FA COMPONENTS & SYSTEMS CO., LTD., Tokyo (JP)

( * ) Notice: Subject to any disclaimer, the term of this patent is extended or adjusted under 35 U.S.C. 154(b) by 270 days.

(21) Appl. No.: 14/330,283

(22) Filed: Jul. 14, 2014

(65) Prior Publication Data

US 2014/0320112 A1 Oct. 30, 2014

Related U.S. Application Data

(63) Continuation-in-part of application No. PCT/JP2013/000642, filed on Feb. 6, 2013.

(30) Foreign Application Priority Data

Feb. 29, 2012 (JP) ................................ 2012-043177

(51) Int. Cl.
*G01R 15/18* (2006.01)
*H02H 1/00* (2006.01)

(52) U.S. Cl.
CPC ........... *G01R 15/183* (2013.01); *G01R 15/185* (2013.01); *H02H 1/0007* (2013.01)

(58) Field of Classification Search
CPC ..... G01R 15/183; G01R 15/185; G01R 33/32; G01R 9/04; G01R 15/202; G01R 15/18; G01R 15/148; G01R 33/04; H02H 1/0007; H02H 3/027; H02H 7/22; H04L 2027/0065; H03L 7/1077; H03L 7/091; H03L 7/089; H03L 7/087; B81B 7/0022; G05F 1/573; H01L 29/7815; H01L 29/7826; H02J 2007/0039; H02K 11/27; H03K 17/08; H02M 1/32; H02M 3/156; H02M 1/4225; H01F 38/28
See application file for complete search history.

(56) References Cited

U.S. PATENT DOCUMENTS 4,482,862 A 11/1984 Leehey
4,914,385 A 4/1990 Arinobu
(Continued)

FOREIGN PATENT DOCUMENTS

CN 102110977 A * 6/2011 ............... H02H 7/22
DE 19857327 A1 6/2000
(Continued)

*Primary Examiner* — Son Le
*Assistant Examiner* — Brent J Andrews
(74) *Attorney, Agent, or Firm* — Rabin & Berdo, P.C.

(57) ABSTRACT

A current detecting device includes an exciting coil (3) wound around a magnetic core (2) enclosing a conductor through which flows a measurement current, and an oscillator circuit (4) that generates a square wave voltage which is supplied to the exciting coil (3). Furthermore, the current detecting device includes a duty detector circuit (5) that detects the measurement current based on variation in the duty ratio of the square wave voltage output from the oscillator circuit (4), a frequency detector circuit (7) that detects an overcurrent of the measurement current based on the frequency of the square wave voltage output from the oscillator circuit (4), and an oscillation amplitude detector circuit (6) that detects an overcurrent of the measurement current based on the magnitude of the square wave voltage output from the oscillator circuit (4).

12 Claims, 10 Drawing Sheets

(56) References Cited

U.S. PATENT DOCUMENTS

| | | | |
|---|---|---|---|
| 5,008,612 A | | 4/1991 | Otto |
| 5,076,260 A | * | 12/1991 | Komatsu .............. A47C 21/006 |
| | | | 601/47 |
| 2011/0006779 A1 | * | 1/2011 | Kobayashi ........... G01R 15/185 |
| | | | 324/537 |

FOREIGN PATENT DOCUMENTS

| | | |
|---|---|---|
| JP | 59-218969 A | 12/1984 |
| JP | S60-173475 A | 9/1985 |
| JP | 2923307 B2 | 7/1999 |
| JP | H11-337590 A | 12/1999 |
| JP | 2000-162244 A | 6/2000 |
| JP | 2004-037147 A | 2/2004 |
| JP | 2012-002723 A | 1/2012 |

* cited by examiner (a) B-H CHARACTERISTIC SCHEMATIC VIEW (WHEN I = 0)

(b) $I_L$-$\mu$,L CHARACTERISTIC DIAGRAM (WHEN I = 0)

(a) B-H CHARACTERISTIC SCHEMATIC VIEW (WHEN I = I$_1$)

(b) I$_L$-L CHARACTERISTIC DIAGRAM (WHEN I = I$_1$)

(a) B-H CHARACTERISTIC SCHEMATIC VIEW (WHEN I = $I_2$)

(b) $I_L$-L CHARACTERISTIC DIAGRAM (WHEN I = $I_2$)

(a) B-H CHARACTERISTIC SCHEMATIC VIEW (WHEN I = $I_3$)

(b) $I_L$-L CHARACTERISTIC DIAGRAM (WHEN I = $I_3$)

CURRENT DETECTING DEVICE

CROSS-REFERENCE TO RELATED APPLICATIONS

This application is a bypass continuation application of international application number PCT/JP2013/000642, filed on Feb. 6, 2013 and designating the Untied States. Furthermore, this application claims the benefit of foreign priority of Japanese application 2012-043177, filed on Feb. 29, 2012. The disclosures of these earlier applications are hereby incorporated herein by reference.

TECHNICAL FIELD

The present invention relates to a current detecting device that can be applied to an earth leakage circuit breaker, an earth leakage alarm device, or the like.

BACKGROUND ART

Although current detecting devices having various configurations have been proposed and put into use as current detecting devices, a fluxgate type of current sensor is known as a structurally simple current detecting device that can detect a slight current (for example, refer to PTL 1, which is identified below).

A current sensor of a heretofore known example described in PTL 1 has the structure shown in FIG. 10(a). That is, the current sensor includes circular cores 101 and 102 made of a soft magnetic body, configured to be of the same form and size, an exciting coil 103 wound the same number of times around each of the cores 101 and 102, and a detector coil 104 wound as one so as to encompass each of the cores 101 and 102.

An unshown alternating current power supply is connected to the exciting coil 103, and an unshown detector circuit is connected to the detector coil 104. Further, a measurement target conductor 105, which forms a target for measuring current, is inserted through the centers of the two cores 101 and 102.

The exciting coil 103 is wound around the cores 101 and 102 so that magnetic fields generated in the two cores 101 and 102 are of opposite phases, and cancel each other out when the exciting coil 103 is energized.

Further, temporal variation of a magnetic flux density B generated in each of the cores 101 and 102 when the exciting coil 103 is energized with an exciting current iex is as shown in FIG. 10(b). When a magnetic field size H is within a predetermined range, the magnetic characteristics of the cores 101 and 102 made of a soft magnetic body are such that the magnetic field size H and magnetic flux density B have a linear relationship. However, when the magnetic field size H exceeds a predetermined value, the relationship is such that there is a state of magnetic saturation wherein the magnetic flux density B does not vary, because of which, when the exciting coil 103 is energized with the exciting current iex, the magnetic flux density B generated in each of the cores 101 and 102 changes to a trapezoidal wave form with vertical symmetry, as shown by solid lines in the drawing, and moreover, the phases are in a state displaced 180° from each other.

Herein, assuming that the measurement target conductor 105 is energized by a direct current value I from above, as shown by an arrow, the magnetic flux densities, which correspond to the size of the direct current, overlap, as a result of which the magnetic flux density B is in a state wherein the width of the upper trapezoidal wave of the trapezoidal waves is expanded, while the width of the lower trapezoidal wave is contracted, as shown by broken lines in FIG. 10(b).

Herein, when expressing variation in the magnetic flux density B generated in the two cores 101 and 102 as sinusoidal waves (corresponding to electromotive force), they are as shown in FIG. 10(c). In FIG. 10(c), sinusoidal waves (electromotive force) of a frequency f whose phases are displaced 180° appear, as shown by solid lines in the drawing, corresponding to the trapezoidal waves shown by solid lines in the previously described FIG. 10(b), but as they are displaced by 180°, they cancel each other out. Meanwhile, second harmonics of a double frequency 2f, of the kind shown by broken lines in FIG. 10(c), appear corresponding to the trapezoidal waves shown by broken lines in FIG. 10(b). The phases of the second harmonics are displaced 180°, because of which, when the second harmonics overlap each other, they become a sinusoidal wave signal of the kind shown on the lowest level of FIG. 10(c), and the sinusoidal wave signal is detected by the detector coil 104.

The detection signal picked up by the detector coil 104 corresponds to the current value I of the direct current flowing through the measurement target conductor 105, and it is possible to detect the current value I by processing the detection signal.

Also, a current sensor including one or more first detection transformers that include a primary coil through which a current to be detected is caused to flow and a secondary coil, electrically insulated from the primary coil, magnetically coupled to the primary coil by a magnetic core, and a detection means that includes a means for alternately supplying magnetizing currents of opposite directions to the secondary coil in order to cyclically drive the magnetic core, which includes a means for detecting saturation and causing the direction of a magnetizing current to be inverted accordingly, to a saturated state, and a processing means for outputting an output signal substantially proportional to a detected current, has been proposed as another heretofore known example (for example, refer to PTL 2).

The current sensor further includes a second detection transformer having a low-pass filter, connected to the secondary coil of the first detection transformer, that divides a low frequency or direct current component of a magnetizing current generated in the secondary coil in accordance with a detected current, a primary coil through which a detected current passes, and a secondary coil, wherein the input side of the secondary coil is coupled to an output portion of the low-pass filter, and the output side of the secondary coil is grounded by a resistor in which is generated an output signal of the current sensor.

CITATION LIST

Patent Literature

PTL 1: JP-A-2000-162244
PTL 2: Japanese Patent No. 2,923,307

SUMMARY OF INVENTION

Technical Problem

However, the heretofore known example described in PTL 1 is such that the two cores 101 and 102 are used. As it is difficult in practice to cause the magnetic characteristics of the cores 101 and 102 to coincide perfectly, voltage generated by the exciting current iex is generated without being completely cancelled out due to a difference in the magnetic characteristics. This causes the S/N ratio of a detection voltage corresponding to a second harmonic component to worsen, and there is an unsolved problem in that detection of a slight current is difficult.

Also, the form of the trapezoidal wave of a second harmonic corresponding to the current value I output from the detector coil 104 becomes distorted, as shown by broken lines in FIG. 10(*b*), when the current value I is too large, because of which the relationship between the current I and second harmonic component ceases to be a proportional relationship. Because of this, the detection range of the current value I is limited, because of which there is also an unsolved problem in that it is not possible to detect a wide range of current.

Also, as at least two cores are used, there is also an unsolved problem in that it is difficult to realize a reduction in size or a reduction in cost.

Also, the heretofore known example described in PTL 2 is such that, as it is necessary to provide a first detection transformer and second detection transformer, there is an unsolved problem in that it is not possible to detect a wide range of current using one magnetic core.

Furthermore, there is also an unsolved problem in that when an excessive direct current flows through a measurement target wire, this cannot be detected.

Therefore, the invention, focusing on the heretofore described problems, has an object of providing a current detecting device such that it is possible to detect a wide range of current using one magnetic core, and possible, when an excessive current flows, to reliably detect the excessive current.

Solution to Problem

In order to achieve the heretofore described object, the invention is formed of the following kind of configuration. A current detecting device according to one aspect of the invention is characterized by including an exciting coil wound around a magnetic core enclosing a conductor through which flows a measurement current, an oscillation means for generating a square wave voltage that causes the magnetism of an exciting current supplied to the exciting coil to invert in accordance with a set threshold value, with the magnetic core in a saturated state or a state in the vicinity thereof, a current detection means for detecting the measurement current based on variation in the duty of the square wave voltage output from the oscillation means, a first overcurrent detection means for detecting an overcurrent of the measurement current based on the frequency of the square wave voltage output from the oscillation means, and a second overcurrent detection means for detecting an overcurrent of the measurement current based on the wave height value of the square wave voltage output from the oscillation means.

Also, the current detection means may detect a variation in the duty of the square wave voltage, and detect a first overcurrent of the measurement current based on the result of the detection. The first overcurrent detection means may detect a variation in the frequency of the square wave voltage, and detect a second overcurrent of the measurement current based on the result of the detection. The second overcurrent detection means may detect a variation in the wave height value of the square wave voltage, and detect a third overcurrent of the measurement current based on the result of the detection.

Furthermore, the current detecting device according to the heretofore described aspect may further include an output means for outputting the fact that the measurement current is an overcurrent when the current detection means detects a first overcurrent of the measurement current, the first overcurrent detection means detects a second overcurrent of the measurement current, or the second overcurrent detection means detects a third overcurrent of the measurement current.

Also, a current detecting device according to another aspect of the invention is characterized by including an exciting coil wound around a magnetic core enclosing a conductor through which flows a measurement current, an oscillation means for generating a square wave voltage that causes the magnetism of an exciting current supplied to the exciting coil to invert in accordance with a set threshold value, with the magnetic core in a saturated state or a state in the vicinity thereof, a current detection means for detecting the duty ratio of the square wave voltage output from the oscillation means, and detecting that the measurement current is a first overcurrent based on the result of the detection, a first overcurrent detection means for detecting variation in the frequency of the square wave voltage output from the oscillation means, and detecting that the measurement current is a second overcurrent based on the result of the detection, and a second overcurrent detection means for detecting variation in the wave height value of the square wave voltage output from the oscillation means, and detecting that the measurement current is a third overcurrent based on the result of the detection.

The current detection means may include a duty ratio detector circuit that detects the duty ratio of the square wave voltage output from the oscillation means, and a first comparator circuit that compares the duty ratio detected by the duty ratio detector circuit with a preset reference value, and outputs a signal to the effect that it has been detected that the measurement current is a first overcurrent when the duty ratio is equal to or lower than the reference value.

The first overcurrent detection means may include a high-pass filter circuit that carries out a filtering process on the square wave voltage output from the oscillation means, a first absolute value detector circuit that detects the absolute value of the output of the high-pass filter circuit, and a second comparator circuit that compares the absolute value detected by the first absolute value detector circuit with a preset first reference value, and outputs a signal to the effect that it has been detected that the measurement current is a second overcurrent when the absolute value is equal to or higher than the first reference value.

The second overcurrent detection means may include a second absolute value detector circuit that detects the absolute value of the square wave voltage output from the oscillation means, and a third comparator circuit that compares the absolute value detected by the second absolute value detector circuit with a preset second reference value, and outputs a signal to the effect that it has been detected that the measurement current is a third overcurrent when the absolute value is equal to or lower than the second reference value.

The current detecting device according to the heretofore described other aspect may further include an OR circuit into which is input the output signal of the first comparator circuit, the output signal of the second comparator circuit, and the output signal of the third comparator circuit. Each output signal may be a high level signal.

Advantageous Effects of Invention

In this way, the invention is such that the current detection means detects a measurement current based on a variation in the duty of a square wave voltage output from the oscillation means.

Also, the first overcurrent detection means detects an overcurrent based on the frequency of the square wave voltage output from the oscillation means.

Furthermore, the second overcurrent detection means detects an overcurrent of the measurement current based on the wave height value of the square wave voltage output from the oscillation means.

Because of this, according to the invention, when an overcurrent flows through a conductor, the overcurrent can be detected regardless of whether or not the oscillation means is stopped. Moreover, according to the invention, when an overcurrent flows, it is possible to carry out detection of the overcurrent accurately over a wide detection range.

DESCRIPTION OF EMBODIMENTS

Hereafter, a description will be given, based on the drawings, of an embodiment of the invention.

(Embodiment Configurations)

Figure 1:
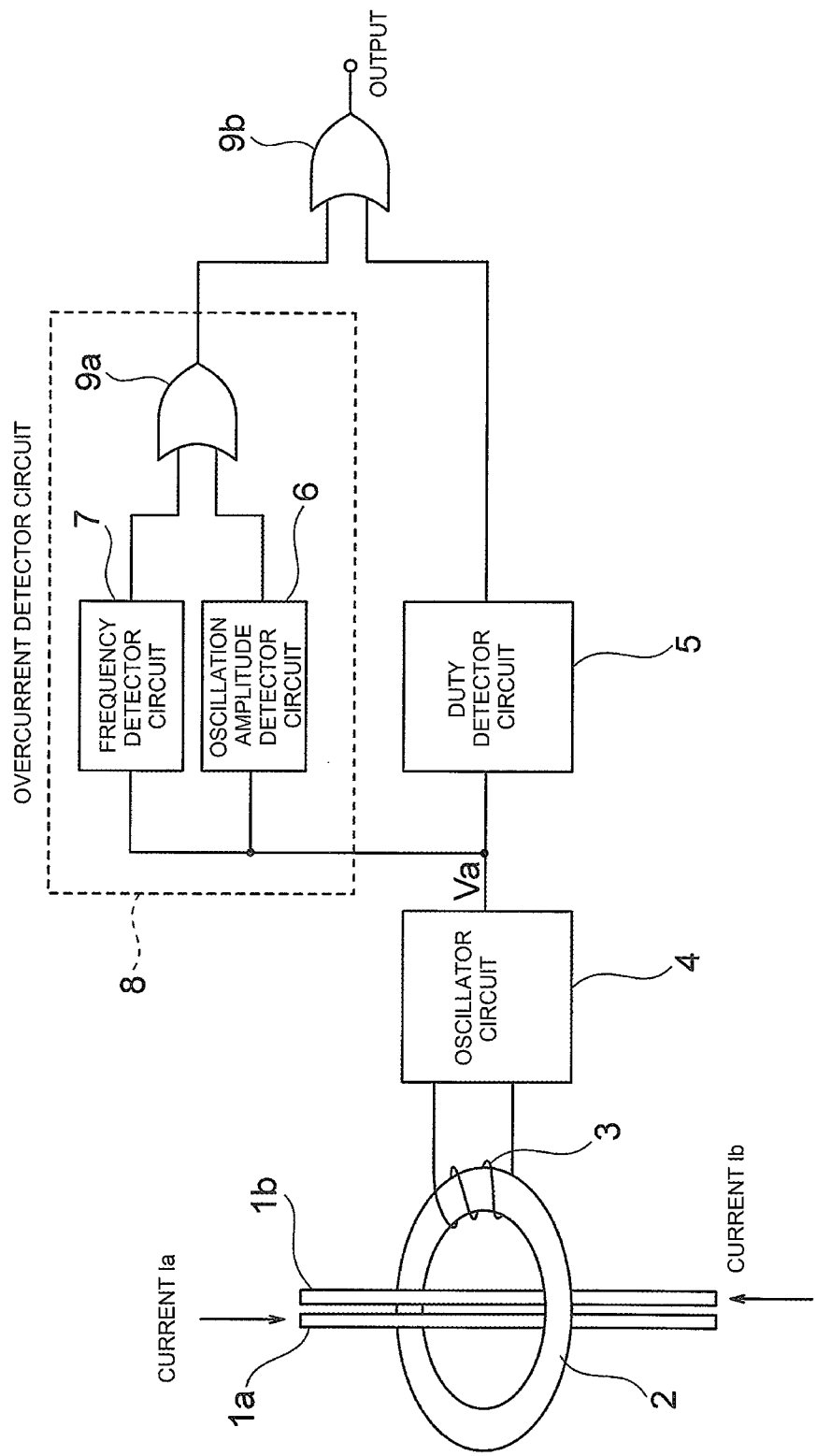
FIG. 1 is a diagram showing the configuration of an embodiment of a current detecting device of the invention.
Figure 2:
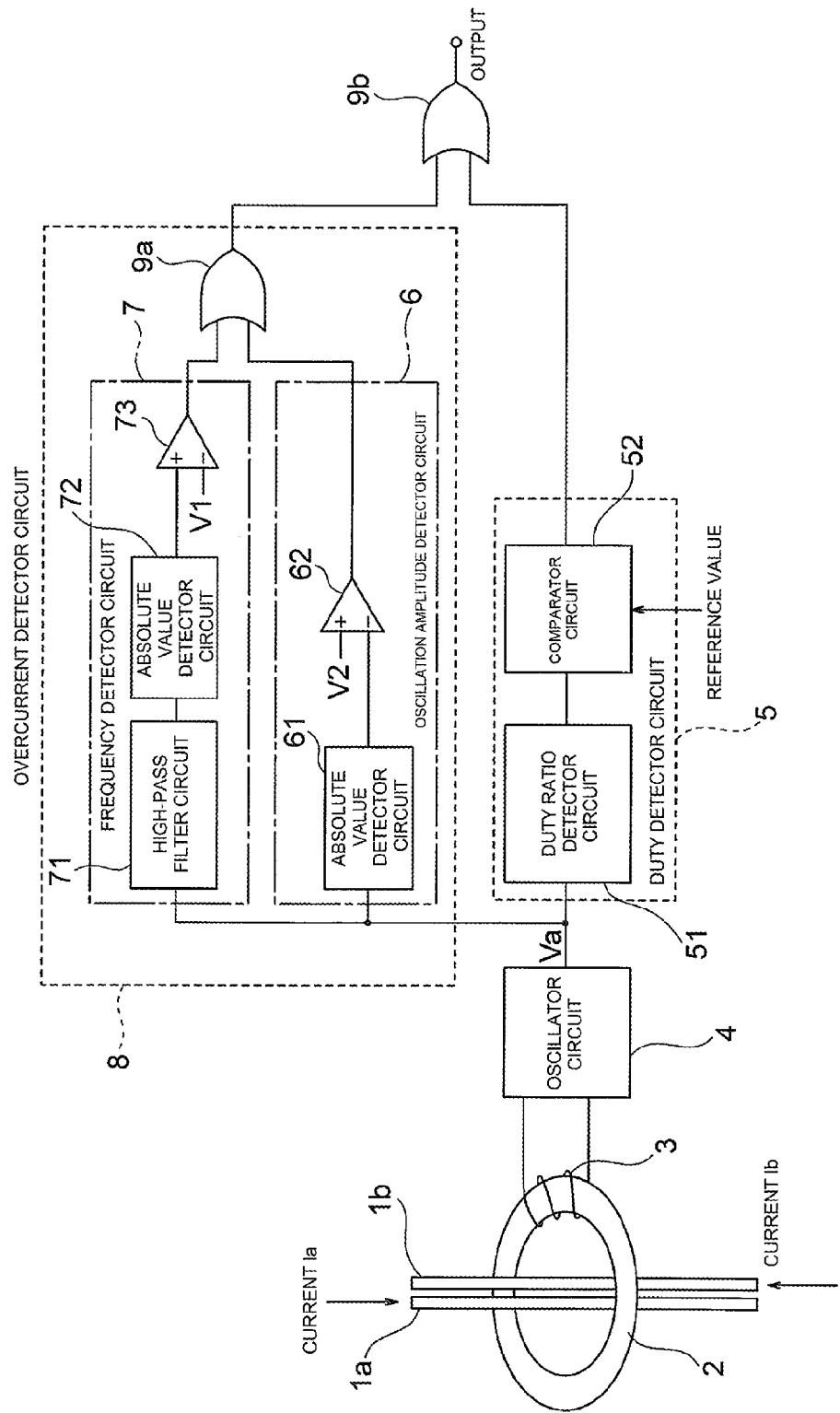
FIG. 2 is a diagram wherein the configuration of each portion of FIG. 1 is made specific.
Figure 3:
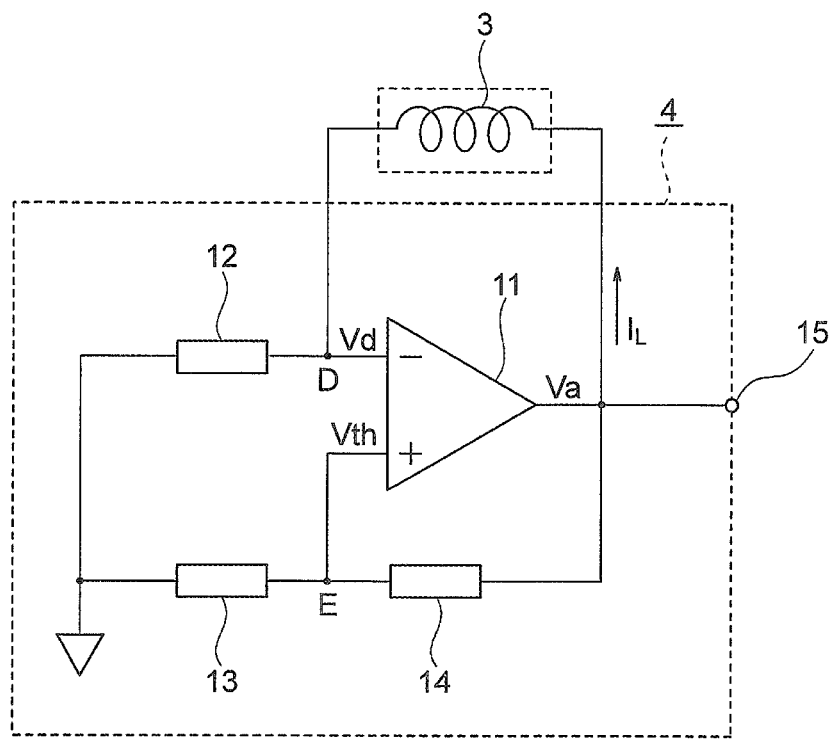
FIG. 3 is a circuit diagram showing a specific configuration of an oscillator circuit.

FIG. 1 is a diagram showing the configuration of an embodiment of a current detecting device of the invention. FIG. 2 is a diagram wherein the configuration of each portion of FIG. 1 is made specific. FIG. 3 is a circuit diagram showing a specific configuration of an oscillator circuit.

The current detecting device according to the embodiment, as shown in FIG. 1, detects a measurement current I, which is the difference between currents Ia and Ib flowing through conductors 1a and 1b, and is such that a ring-like magnetic core 2 is disposed around the conductors 1a and 1b. That is, the conductors 1a and 1b are inserted through the magnetic core 2.

The conductors 1a and 1b are provided in, for example, an object of short circuit detection or the like, and are conductors through which flows an alternating current I of, for example, 10A to 800A, wherein the sum of the currents flowing through the conductors 1a and 1b in a sound state is zero, but when the sum of the currents flowing through the conductors 1a and 1b is not zero due to a short circuit, ground fault, or the like, a slight differential current of in the region of, for example, 15 mA to 500 mA, used as an object of detection, flows through the conductors 1a and 1b.

Further, in the embodiment, the current detecting device includes an exciting coil 3, an oscillator circuit 4, a duty detector circuit 5, an oscillation amplitude detector circuit 6, a frequency detector circuit 7, and two OR circuits 9a and 9b, as shown in FIG. 1. Herein, the oscillation amplitude detector circuit 6 and frequency detector circuit 7 configure an overcurrent detector circuit 8.

The oscillator circuit 4 and duty detector circuit 5 correspond respectively to oscillation means and current detection means of the invention. Also, the frequency detector circuit 7 and oscillation amplitude detector circuit 6 correspond respectively to first overcurrent detection means and second overcurrent detection means of the invention.

The exciting coil 3 is wound a predetermined number of times around the magnetic core 2, and an exciting current is supplied to the exciting coil 3 from the oscillator circuit 4.

The oscillator circuit 4, as will be described hereafter, generates a square wave voltage that inverts the magnetism of the exciting current supplied to the exciting coil 3, with the magnetic core 2 in a saturated state or a state in the vicinity thereof, in accordance with a set threshold value.

Because of this, the oscillator circuit 4 includes an operational amplifier 11 that acts as a comparator, as shown in FIG. 3. The exciting coil 3 is connected between the output side and the inverting input side of the operational amplifier 11. Also, the inverting input side of the operational amplifier 11 is connected to the ground via a resistor 12, while the non-inverting input side of the operational amplifier 11 is connected between voltage dividing resistors 13 and 14 connected in series between the output side of the operational amplifier 11 and the ground. Further, the output side of the operational amplifier 11 is connected to an output terminal 15.

The duty detector circuit 5, based on an output voltage Va of the oscillator circuit 4, detects the duty ratio of the output voltage Va, and detects the measurement current I based on the result of the detection, as will be described hereafter. Also, the duty detector circuit 5, based on the detected duty ratio, detects whether or not the measurement current I is a first overcurrent and, when a first overcurrent is detected, outputs a high level signal indicating the fact to the OR circuit 9b.

The frequency detector circuit 7, based on the frequency of the output voltage Va of the oscillator circuit 4, detects whether or not the measurement current I is a second overcurrent and, when a second overcurrent is detected, outputs a high level signal indicating the fact to the OR circuit 9a, as will be described hereafter.

The oscillation amplitude detector circuit 6, based on the wave height value of the output voltage Va output from the oscillator circuit 4, detects whether or not the measurement current I is a third overcurrent and, when a third overcurrent is detected, outputs a high level signal indicating the fact to the OR circuit 9a, as will be described hereafter.

The OR circuit 9a carries out logical sum processing on the output signal of the frequency detector circuit 7 and the output signal of the oscillation amplitude detector circuit 6, and outputs the result of the processing to the OR circuit 9b.

Also, the OR circuit 9b carries out logical sum processing on the output signal of the duty detector circuit 5 and the output signal of the OR circuit 9a.

Next, a description will be given, referring to FIG. 2, of a specific configuration of each of the duty detector circuit 5, oscillation amplitude detector circuit 6, and frequency detector circuit 7 shown in FIG. 1.

The duty detector circuit 5, as shown in FIG. 2, includes a duty ratio detector circuit 51 and a comparator circuit 52.

The duty ratio detector circuit 51 detects the duty ratio of the output voltage Va output from the oscillator circuit 4. The comparator circuit 52 compares the duty ratio detected by the duty ratio detector circuit 51 with a preset reference value and, when the duty ratio is equal to or lower than the reference value, outputs a high level signal indicating that an overcurrent has been detected.

The frequency detector circuit 7, as shown in FIG. 2, includes a high-pass filter circuit 71, an absolute value detector circuit 72, and a comparator circuit (comparator) 73.

The high-pass filter circuit 71 carries out a filtering process on, and outputs, the output voltage Va output from the oscillator circuit 4. The absolute value detector circuit 72 detects the absolute value of the output voltage of the high-pass filter circuit 71. The comparator circuit 73 compares the absolute value detected by the absolute value detector circuit 72 with a preset reference voltage V1 and, when the absolute value is equal to or higher than the reference voltage V1, outputs a high level signal as a signal indicating that an overcurrent has been detected.

The oscillation amplitude detector circuit 6, as shown in FIG. 2, includes an absolute value detector circuit 61 and a comparator circuit (comparator) 62.

The absolute value detector circuit 61 detects the absolute value (wave height value) of the output voltage Va output from the oscillator circuit 4. The comparator circuit 62 compares the absolute value detected by the absolute value detector circuit 61 with a preset reference voltage V2 and, when the absolute value is equal to or lower than the reference voltage V2, outputs a high level signal as a signal indicating that an overcurrent has been detected.

(Embodiment Operations)

Next, a description will be given, referring to the drawings, of examples of embodiment operations.

(Oscillator Circuit Operation)

Firstly, referring to FIG. 3, a description will be given of an operation of the oscillator circuit 4.

Figure 9:
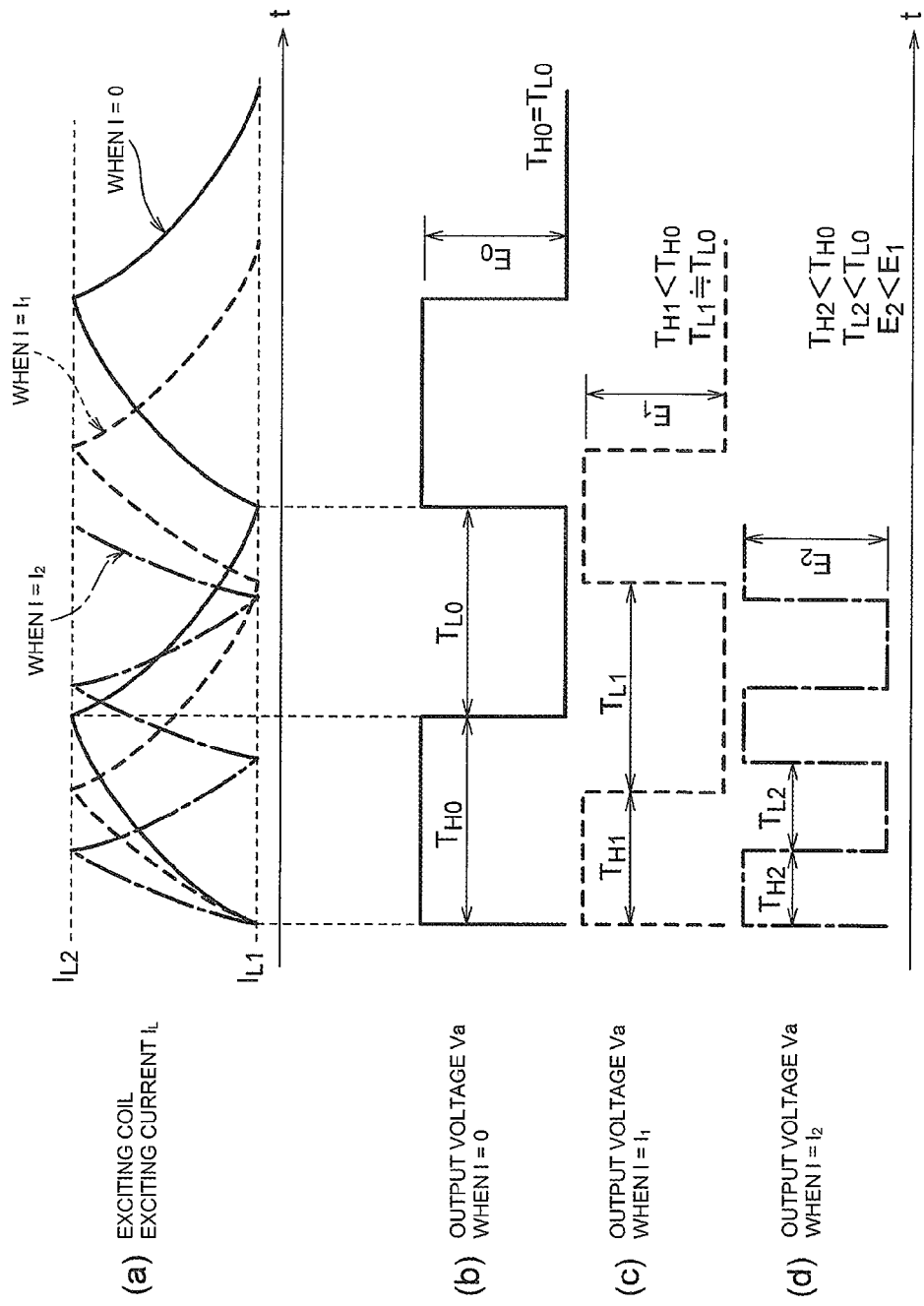
FIG. 9 is waveform diagrams showing waveform examples of each portion of the embodiment.
Figure 10:
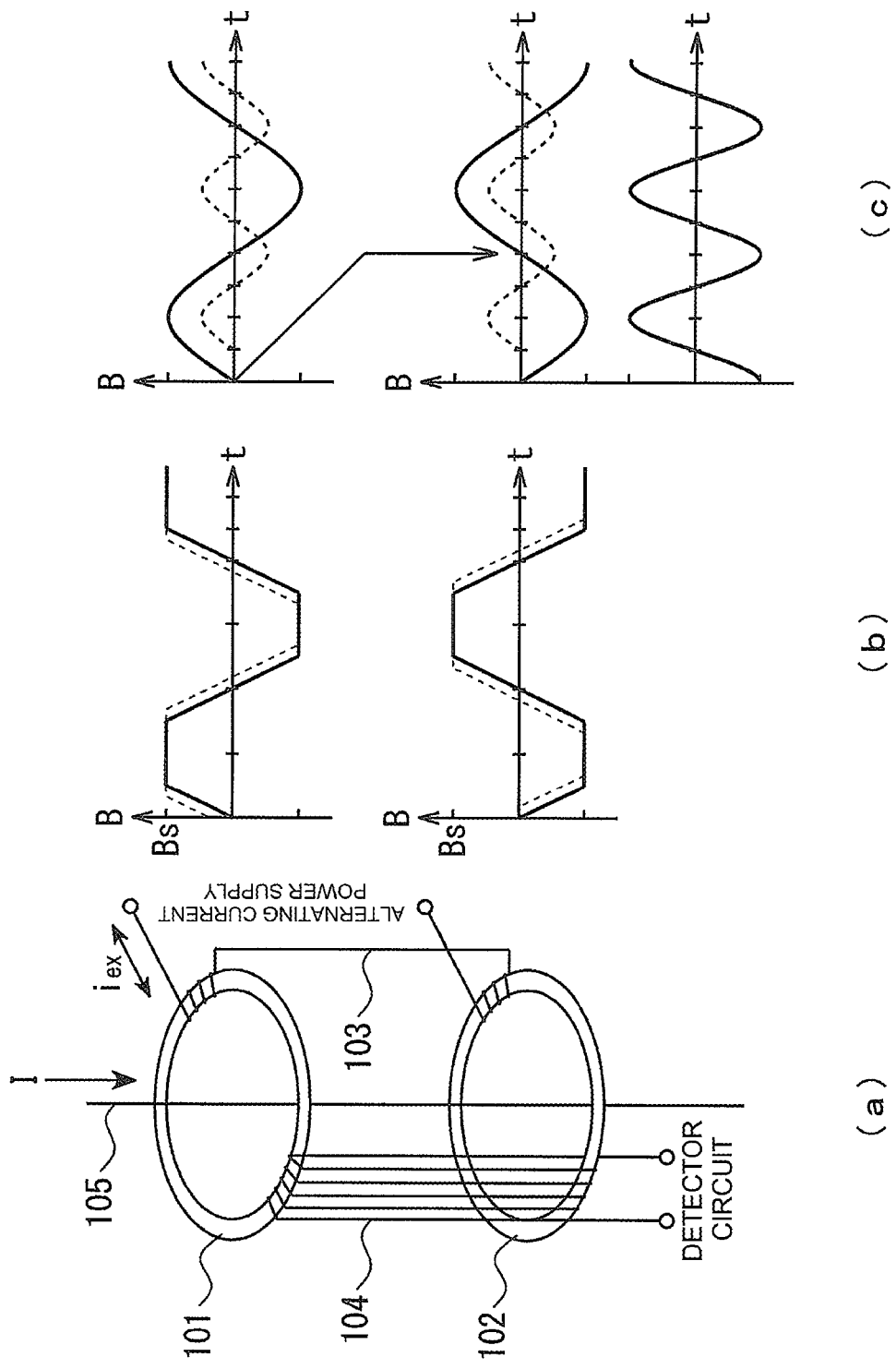
FIG. 10 is diagrams illustrating a heretofore known device.

In the oscillator circuit 4, a threshold voltage Vth of a connection point E of the voltage dividing resistors 13 and 14 is supplied to the non-inverting input side of the operational amplifier 11, the threshold voltage Vth and a voltage Vd of a connection point D of the exciting coil 3 and resistor 12 are compared, and the comparison output is output from the output side as the square wave output voltage Va (for example, refer to FIGS. 9(b) to (d)).

When the output voltage Va of the output side of the operational amplifier 11 is at a high level at this point, it is applied to the exciting coil 3. Because of this, the exciting coil 3 is excited by an exciting current $I_L$ in accordance with the output voltage Va and a resistance value R12 of the resistor 12. At this time, the exciting current $I_L$ rises at a time constant determined by an inductance L of the exciting coil 3 and the resistance value R12 of the resistor 12, as shown in FIG. 9(a).

At this point, as the connection point E of the resistor 13 and resistor 14 is connected to the non-inverting input side of the operational amplifier 11, voltage divided between the resistor 13 and resistor 14 is input as the threshold voltage Vth. Meanwhile, the voltage Vd of the connection point D of the exciting coil 3 and resistor 12 on the inverting input side of the operational amplifier 11 increases in accordance with an increase in the exciting current $I_L$ of the exciting coil 3. Further, when the voltage Vd=R12×$I_L$ exceeds the threshold voltage Vth, the output voltage Va of the operational amplifier 11 inverts to a low level.

In response to this, the polarity of the exciting current $I_L$ flowing through the exciting coil 3 inverts, and the time constant of the exciting current $I_L$ determined by the inductance L of the exciting coil 3 and the resistance value R12 of the resistor 12 decreases.

At this time, as the output voltage Va is at a low level, the threshold voltage Vth also becomes a low voltage. Further, the voltage Vd of the connection point D decreases in accordance with the decrease in the exciting current $I_L$ of the exciting coil 3, and on the voltage Vd dropping below the threshold voltage Vth, the output voltage Va of the operational amplifier 11 inverts to a high level, as shown in FIGS. 9(b) to (d).

In FIG. 9(a), a threshold value exciting coil current for inverting from a high level to a low level is assumed to be $I_{L2}$, while a threshold value exciting coil current for inverting from a low level to a high level is assumed to be $I_{L1}$.

Because of this kind of operation, the output voltage Va of the oscillator circuit 4 is a square wave voltage that repeatedly alternates between a high level and a low level, as shown in FIGS. 9(b) to (d), and the oscillator circuit 4 operates as an astable multivibrator. Further, the exciting current of the exciting coil 3 is a sawtooth wave current that repeatedly alternates between increasing and decreasing, as shown in FIG. 9(a).

Figure 4:
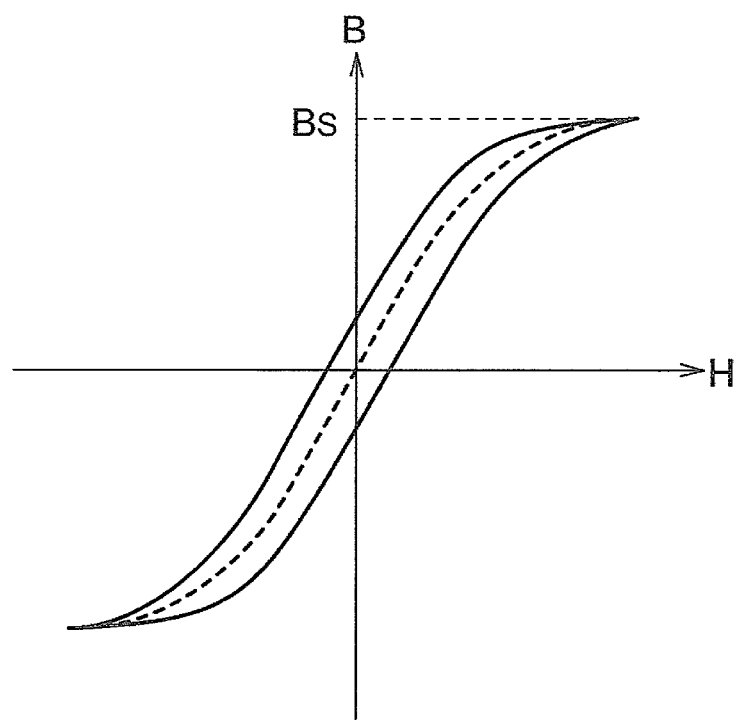
FIG. 4 is a diagram illustrating a B-H characteristic curve of a magnetic core.

Meanwhile, a soft magnetic material having a high magnetic permeability μ is used as the core material of the magnetic core 2. On current flowing through an exciting coil wound around a circular ring magnetic core in which this kind of core is used, a magnetic field H is generated by the current in the core, and a magnetic flux of a magnetic flux density B is generated inside the core. The characteristics of the core magnetic field H and magnetic flux density B (B-H characteristics) are such that when the magnetic field H increases, the magnetic flux density B increases sharply, as shown in FIG. 4. Further, when the magnetic field H rises to a certain value or higher, the rise of the magnetic flux density B becomes gentler, after which the magnetic flux density B reaches a saturation region (saturation magnetic flux density Bs) in which the magnetic flux density is saturated.

(Relationship Between Magnetic Core and Oscillator Circuit)

Next, a description will be given of the relationship between the magnetic core 2 and oscillator circuit 4.

Herein, the B-H characteristics of the magnetic core 2 actually have hysteresis, as shown by solid lines in FIG. 4. In order for the description to be easily understood, however, it is assumed that the B-H characteristics of the magnetic core 2 have characteristics of a value in the center of the hysteresis, shown by a broken line in FIG. 4.

At this point, it is assumed that the square wave voltage from the oscillator circuit 4 is applied to the exciting coil 3 wound around the magnetic core 2. When a measurement current I=0 flows inside the circular ring of the magnetic core 2 at this time, the magnetic field H and magnetic flux density B inside the magnetic core 2 are such that a heavy line portion of the B-H characteristics of FIG. 5(a) forms an operation region. That is, the magnetic core 2 is used in a state wherein the magnetic field H and magnetic flux density B inside the magnetic core 2 are symmetrical on a positive side and negative side.

Figure 5:
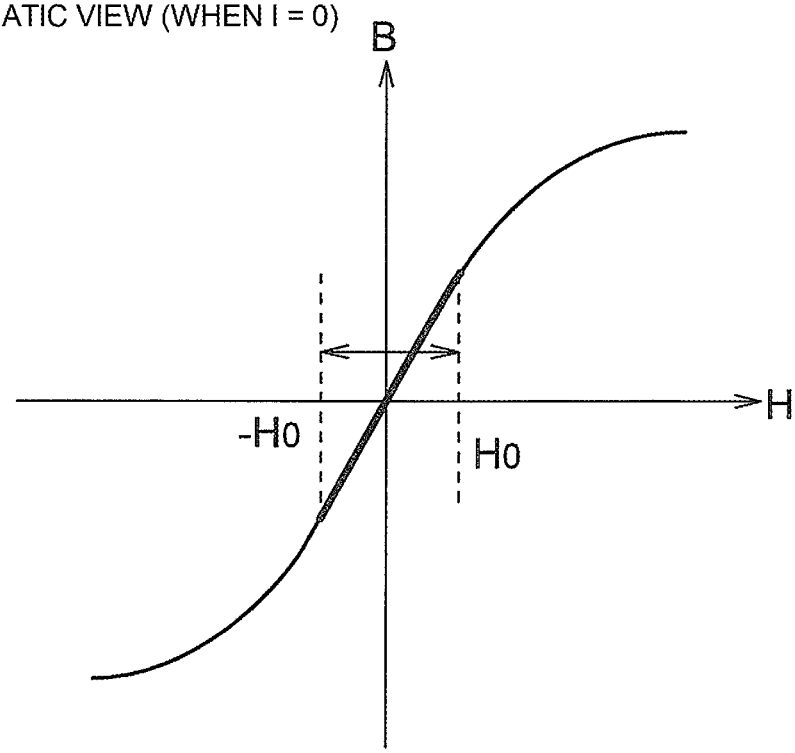
FIG. 5 is diagrams illustrating the relationship between the magnetic core and oscillator circuit when a measurement current I=0.
Figure 5:
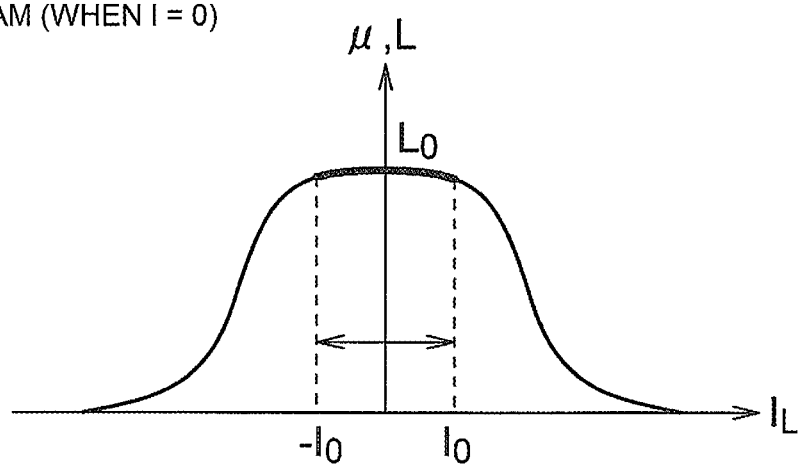

Also, assuming the average magnetic path length of the magnetic core 2 to be lm, and the number of times the exciting coil 3 is wound around the magnetic core 2 to be N, there is a relationship of N×$I_L$=H×lm, because of which the magnetic field H is proportional to the exciting current $I_L$, and the magnetic permeability µ is the slope of the B-H characteristics (µ=dB/dH), meaning that the relationship between the exciting current $I_L$ and magnetic permeability µ can be expressed by FIG. 5(b).

Also, the inductance L of the exciting coil 3 can be expressed by the following expression.

$$L = N \times \frac{d\Phi}{dI_L}$$ [Math. 1]

$$= N \times \frac{d(BS)}{d\left(\frac{Hlm}{N}\right)}$$

$$= N^2 \times \frac{S}{lm} \times \frac{dB}{dH}$$

$$= N^2 \times \frac{S}{lm} \times \mu$$

Herein, φ is the magnetic flux inside the magnetic core 2, while S is the sectional area of the magnetic core 2.

According to the above expression, the inductance L of the exciting coil 3 is proportional to the magnetic permeability µ, because of which FIG. 5(b) can be also seen as a characteristic curve representing the relationship between the exciting current $I_L$ and inductance L. In the case of the measurement current I=0, an operation region of FIG. 5(b) is the heavy line portion of the solid line, because of which the inductance L of the exciting coil 3 is a practically constant value ($L_0$).

Consequently, in the case of the measurement current I=0 flowing inside the circular ring of the magnetic core 2, the inductance L of the exciting coil 3 is the same value $L_0$, regardless of whether the exciting current $I_L$ of the exciting coil 3 of the oscillator circuit 4 is increasing or decreasing. Because of this, the time constant is of the same value when the exciting current $I_L$ is increasing and when it is decreasing, and the high level and low level of the output voltage (square wave voltage) Va of the oscillator circuit 4 have a duty ratio of 1:1.

Because of this, when the measurement current I=0, the exciting current $I_L$ of the exciting coil 3 is as shown by the solid line of FIG. 9(a), while the output voltage of the oscillator circuit 4 is as shown by the solid line of FIG. 9(b).

Next, it will be assumed that a current $I_1$ flows as the measurement current I in the circular ring of the magnetic core 2.

The current $I_1$, being a current which is the difference between the current Ia flowing through the conductor 1a and the current Ib flowing through the conductor 1b, is a current that corresponds to a short circuit or ground fault. When the current $I_1$ flows, a magnetic field $H_1$ generated by the current $I_1$ is generated in the magnetic core 2. Because of the magnetic field $H_1$, the B-H characteristic curve of the magnetic core 2 is a characteristic curve shifted by the amount of the magnetic field $H_1$ with respect to the magnetic field H when the measurement current I=0, as in FIG. 6(a).

Figure 6:
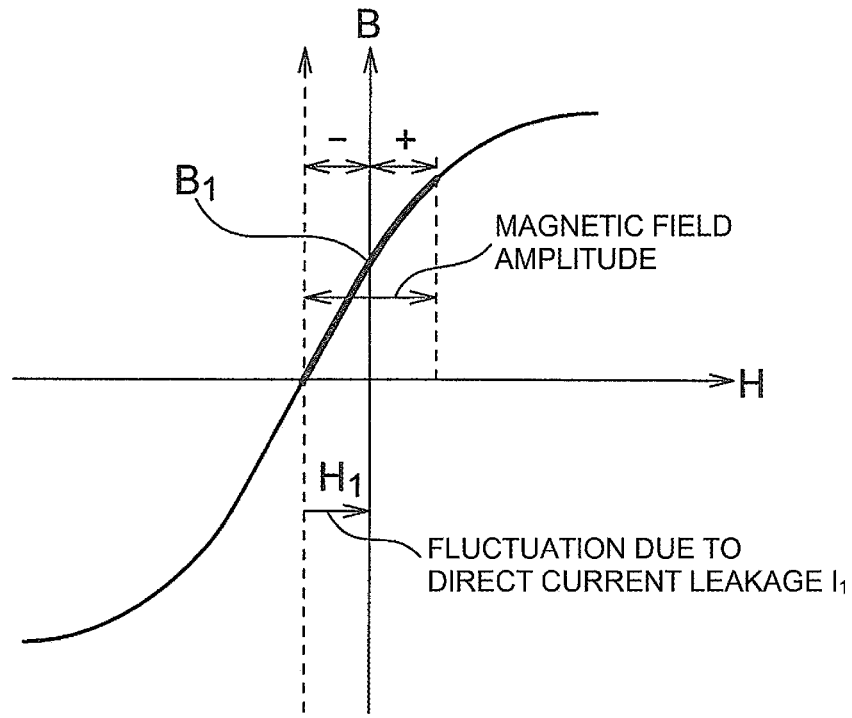
FIG. 6 is diagrams illustrating the relationship between the magnetic core and oscillator circuit when the measurement current I is in a range of 0 to $I_1$.
Figure 6:
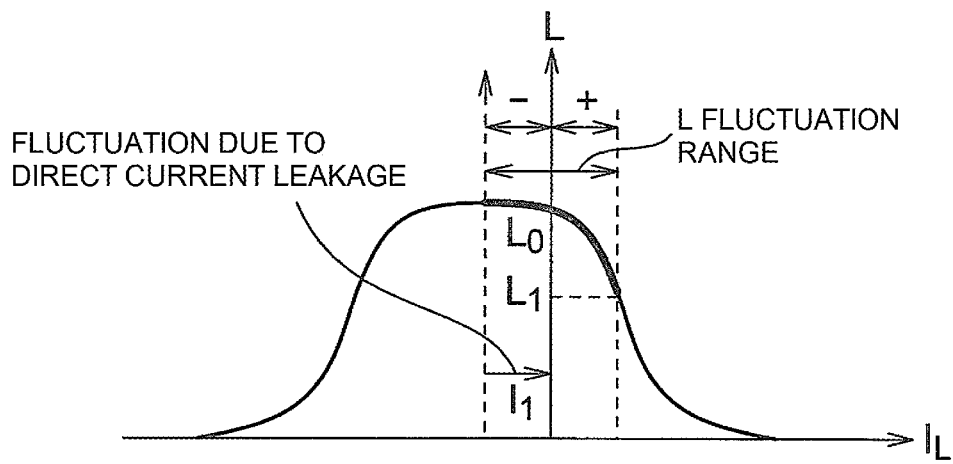

When the square wave voltage from the oscillator circuit 4 is applied to the exciting coil 3 wound around the magnetic core 2 with this kind of characteristics, the operation region of the magnetic core 2 is the heavy line portion of the solid line of FIG. 6(a). Because of this, the heavy line portion of the solid line of FIG. 6(b) is the inductance L of the exciting coil 3 in the operation region. Further, the inductance L of the exciting coil 3 when the exciting current $I_L$ is negative is of practically the same value ($L_0$) as the inductance L when the measurement current I=0, but the inductance L is of a value lower than $L_0$ when the exciting current $I_L$ is positive.

Because of this, when the exciting current $I_L$ increases, the time constant determined by the resistance value R12 of the resistor 12 of the oscillator circuit 4 and the inductance L of the exciting coil 3 is smaller than when the measurement current I=0, because of which the rise of the exciting current $I_L$ is earlier. Meanwhile, when the exciting current $I_L$ decreases, the exciting current $I_L$ falls at practically the same time constant as when the measurement current I=0. Because of this, the exciting current $I_L$ of the exciting coil 3 is as the dotted line of FIG. 9(a), and the output voltage of the oscillator circuit 4 is as the dotted line of FIG. 9(c).

Consequently, an off-level period $T_{L1}$ of the output voltage Va of the oscillator circuit 4 is practically the same as an off-level period $T_{L0}$ when the measurement current I=0, but an on-level period $T_{H1}$ of the output voltage Va is shorter than an on-level period $T_{H0}$ when the measurement current I=0. Because of this, the duty of the on-level and off-level of the output voltage Va of the oscillator circuit 4 varies.

As a result of this, the duty ratio of the output voltage Va, which is the square wave voltage of the oscillator circuit 4, varies in accordance with the measurement current I (the current value of the difference between the current Ia and current Ib) in the range from 0 to $I_1$ of the measurement current I.

Next, when the measurement current I is a current $I_2$ even larger than $I_1$, a magnetic field $H_2$ generated by the current $I_2$ is generated in the magnetic core 2. Because of the magnetic field $H_2$, the B-H characteristic curve of the magnetic core 2 is a characteristic curve shifted by the amount of the magnetic field $H_2$ with respect to the magnetic field H when the measurement current I=0, as in FIG. 7(a).

Figure 7:
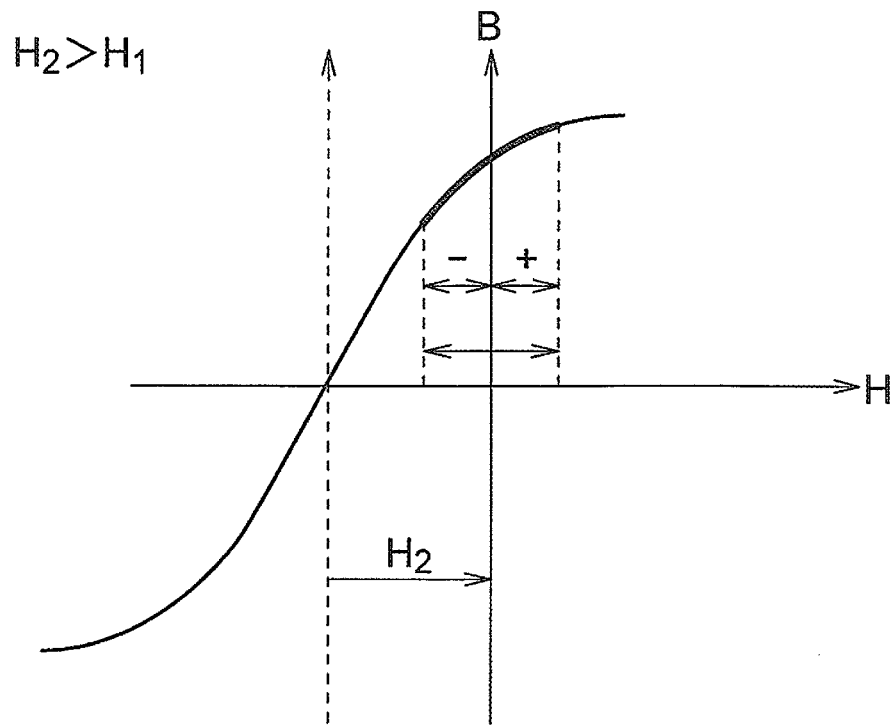
FIG. 7 is diagrams illustrating the relationship between the magnetic core and oscillator circuit when the measurement current I is in a range of $I_1$ to $I_2$.
Figure 7:
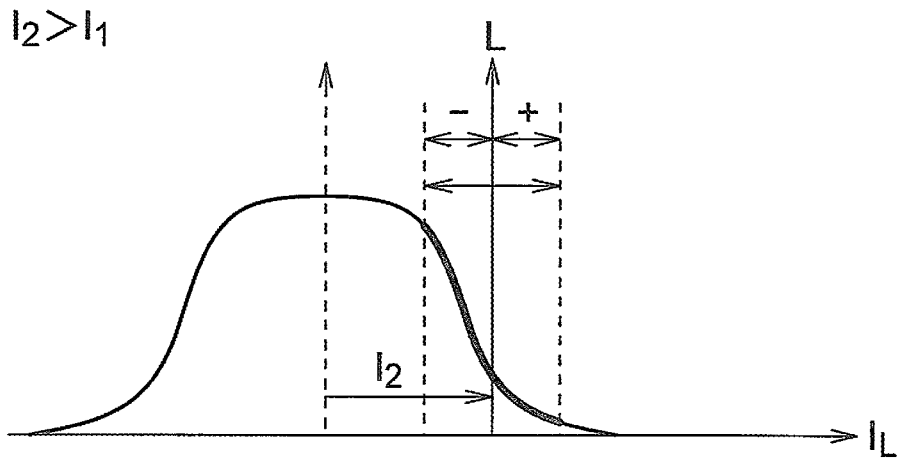

When the square wave voltage from the oscillator circuit 4 is applied to the exciting coil 3 wound around the magnetic core 2 with this kind of characteristics, the operation region of the magnetic core 2 is the heavy line portion of the solid line of FIG. 7(a). Because of this, the heavy line portion of the solid line of FIG. 7(b) is the inductance L of the exciting coil 3 in the operation region. Further, the inductance L of the exciting coil 3 is of a value lower than the inductance $L_0$ when the measurement current I=0, whether the exciting current $I_L$ is positive or negative.

Because of this, the exciting current $I_L$, both when rising and falling, is early in comparison with when the measurement current I=0. Because of this, the exciting current $I_L$ of the exciting coil 3 is as the chain line of FIG. 9(a), and the output voltage Va of the oscillator circuit 4 is as the chain line of FIG. 9(d).

When the measurement current I is $I_2$, even larger than $I_1$, in this way, both an on-level period $T_{H2}$ and an off-level period $T_{L2}$ of the output voltage Va of the oscillator circuit 4 are shorter than the on-level period $T_{H0}$ and off-level period $T_{L0}$ when the measurement current I=0. Because of this, the duty ratio of the on-level period and off-level period ceases to be proportional to the measurement current I, and it is no longer possible to detect the measurement current I simply by detecting the duty ratio.

When the measurement current I is in this kind of detection region, an oscillation frequency f of the output voltage Va, formed of a square wave, of the oscillator circuit 4 can be obtained from the following expression, and is high in comparison with the oscillation frequency f when the measurement current I=0.

$$f=1/(T_{H2}+T_{L2})$$

As the frequency of the output voltage Va of the oscillator circuit 4 increases sharply in this way, the wave height value of the output voltage Va begins to decrease in accordance with the characteristics (slew rate and the like) of the operational amplifier configuring the oscillator circuit 4.

Figure 8:
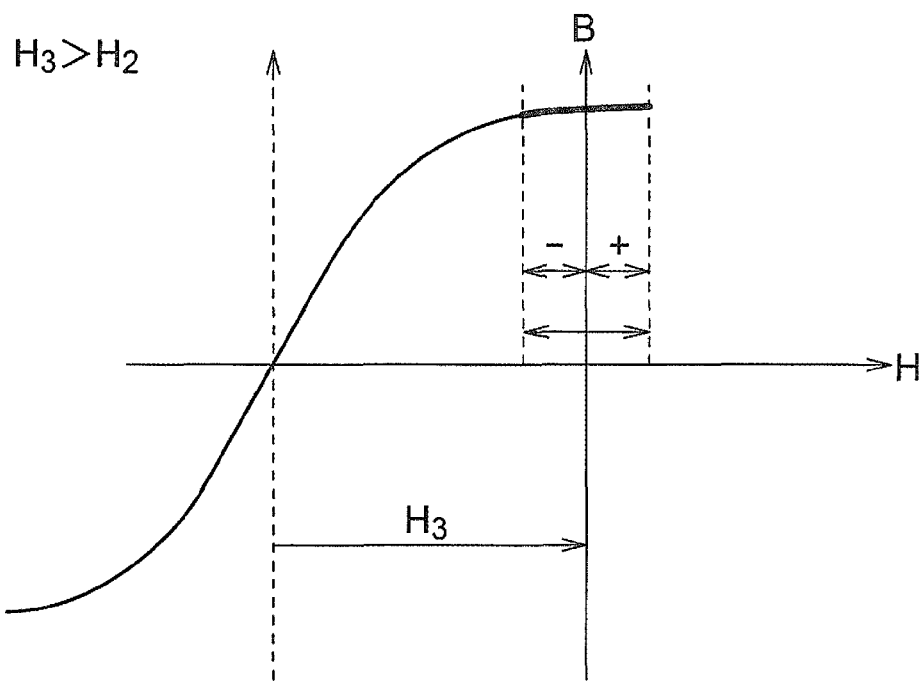
FIG. 8 is diagrams illustrating the relationship between the magnetic core and oscillator circuit when the measurement current I is $I_3$ or larger.
Figure 8:
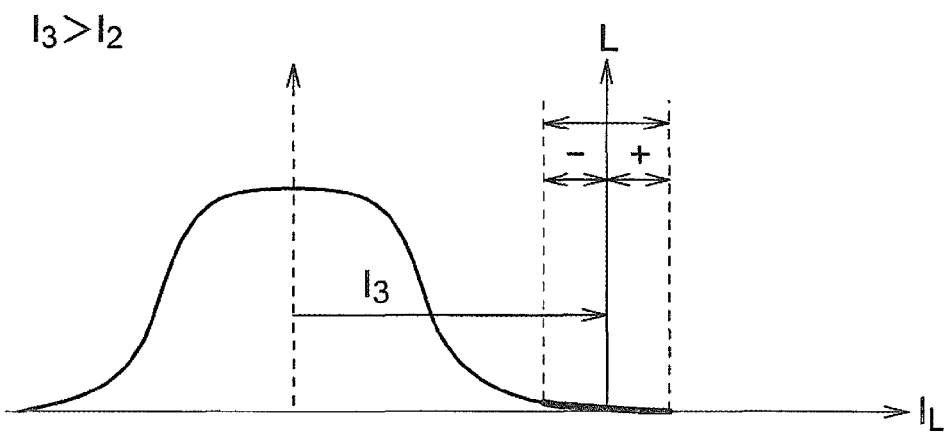

Subsequently, when the measurement current I is $I_3$, even larger than $I_2$, the magnetic core 2 reaches a complete saturation region, as shown in FIG. 8, the inductance L of the exciting coil 3 is practically zero, and the oscillator circuit 4, no longer being able to oscillate, stops oscillation.

The heretofore described relationship between the measurement current I generated in the circular ring of the magnetic core 2 and the state of the output voltage Va of the oscillator circuit 4 is summarized as below.

(1) When the measurement current I=0

At this time, the high level and low level of the output voltage (square wave voltage) Va of the oscillator circuit 4 have a duty ratio of 1:1, as shown by the solid line of FIG. 9(b).

(2) When the measurement current I is in the range from 0 to $I_1$

At this time, the output voltage Va of the oscillator circuit 4 is as the dotted line of FIG. 9(c), and the duty ratio thereof varies in accordance with the measurement current I (the current value of the difference between the current Ia and the current Ib). Consequently, in this range, it is possible to detect the measurement current I by detecting the duty ratio of the output voltage Va of the oscillator circuit 4.

(3) When the measurement current I is in the range from $I_1$ to $I_2$

At this time, the output voltage Va of the oscillator circuit 4 is as the chain line of FIG. 9(d), and the oscillation frequency thereof is high in comparison with when the measurement current I=0. Furthermore, the wave height value (amplitude) of the output voltage Va of the oscillator circuit 4 decreases. Consequently, in this range, it is possible to detect the measurement current I by detecting the frequency or amplitude of the output voltage Va of the oscillator circuit 4.

(4) When the measurement current I is $I_3$ or larger, the oscillator circuit 4 stops the oscillation operation. In this way, the measurement current I and the output voltage Va of the oscillator circuit 4 have the relationships of (1) to (4) above.

Therefore, in the embodiment, whether or not the measurement current I is an excessive current is detected utilizing the relationships of (2) and (3), because of which the duty detector circuit 5, frequency detector circuit 7, and oscillation amplitude detector circuit 6 are each provided at a stage subsequent to the oscillator circuit 4 (refer to FIG. 1 and FIG. 3).

(Operation of Duty Detector Circuit and the Like)

Next, a description will be given, referring to FIG. 1, of an operation of each of the duty detector circuit 5, frequency detector circuit 7, and oscillation amplitude detector circuit 6.

Firstly, when the measurement current I is in the range from 0 to $I_1$, the operation of the duty detector circuit 5 is in effect.

That is, the duty detector circuit 5 measures each of a high level period and low level period of the output voltage Va of the oscillator circuit 4, detects the duty ratio of the output voltage Va based on the result of the measurement, and detects the measurement current I based on the result of the detection. Also, the duty detector circuit 5, based on the detected duty ratio, detects whether or not the measurement current I is a first overcurrent and, when a first overcurrent is detected, outputs a high level signal indicating the fact to the OR circuit 9b.

Next, when the measurement current I is in the range from $I_1$ to $I_2$, the operations of the frequency detector circuit 7 and oscillation amplitude detector circuit 6 are in effect.

That is, the frequency detector circuit 7, based on the frequency of the output voltage Va output from the oscillator circuit 4, detects whether or not the measurement current I is a second overcurrent and, when a second overcurrent is detected, outputs a high level signal indicating the fact to the OR circuit 9a.

Also, the oscillation amplitude detector circuit 6, based on the wave height value of the output voltage Va output from the oscillator circuit 4, detects whether or not the measurement current I is a third overcurrent and, when a third overcurrent is detected, outputs a high level signal indicating the fact to the OR circuit 9a.

The OR circuit 9a carries out logical sum processing of the output signal of the frequency detector circuit 7 and the output signal of the oscillation amplitude detector circuit 6, and outputs the result of the processing to the OR circuit 9b. Also, the OR circuit 9b carries out logical sum processing of the output signal of the duty detector circuit 5 and the output signal of the OR circuit 9a.

Because of this, the OR circuit 9b, on a high level signal being input from any one of the duty detector circuit 5, frequency detector circuit 7, and oscillation amplitude detector circuit 6, outputs a high level signal to the effect that an overcurrent has been detected.

More specifically, as shown in FIG. 2, the duty ratio detector circuit 51 measures each of a high level period and low level period of the output voltage Va output from the oscillator circuit 4, and detects the duty ratio based on the result of the measurement. The comparator circuit 52 compares the duty ratio detected by the duty ratio detector circuit 51 with a preset reference value and, when the duty ratio is equal to or lower than the reference value, outputs a high level signal to the OR circuit 9b indicating that the measurement current I is a first overcurrent.

The high-pass filter circuit 71 carries out a filtering process on the output voltage Va output from the oscillator circuit 4. Herein, when the frequency of the output voltage Va of the oscillator circuit 4 increases, the output voltage of the high-pass filter circuit 71 increases accordingly.

The absolute value detector circuit 72 detects the absolute value of the output voltage of the high-pass filter circuit 71. The comparator circuit 73 compares the absolute value detected by the absolute value detector circuit 72 with the reference voltage V1 preset to correspond to a second overcurrent and, when the absolute value is equal to or higher than the reference voltage V1, outputs a high level signal to the OR circuit 9a indicating that the measurement current I is a second overcurrent.

Also, the absolute value detector circuit 61 detects the absolute value of the square wave voltage output from the oscillator circuit 4. The comparator circuit 62 compares the absolute value detected by the absolute value detector circuit 61 with the reference voltage V2 preset to correspond to a third overcurrent and, when the absolute value is equal to or lower than the reference voltage V2, outputs a high level signal to the OR circuit 9a indicating that the measurement current I is a third overcurrent.

The OR circuit 9a carries out logical sum processing of the output signal of the comparator circuit 73 and the output signal of the comparator circuit 62, and outputs the result of the processing to the OR circuit 9b. Because of this, the OR circuit 9b, on a high level signal being input from any one of the comparator circuit 52, comparator circuit 62, and comparator circuit 73, outputs a high level signal as an official signal indicating that the measurement current I is an overcurrent.

(Advantages of Embodiment)

As heretofore described, this embodiment is such that, when the measurement current I is in the range from 0 to $I_1$, the duty detector circuit 5 detects the duty ratio of the output voltage Va of the oscillator circuit 4, and detects a first overcurrent based on the detection.

Also, this embodiment is such that, when the measurement current I is in the range from $I_1$ to $I_2$, the frequency detector circuit 7 detects a second overcurrent based on variation in the oscillation frequency of the output voltage Va of the oscillator circuit 4, and the oscillation amplitude detector circuit 6 detects a third overcurrent based on variation in the amplitude of the output voltage Va.

Furthermore, the embodiment is such that when a high level signal indicating that there is an overcurrent is output from any one of the duty detector circuit 5, frequency detector circuit 7, and oscillation amplitude detector circuit 6, the high level signal is output.

Because of this, according to the embodiment, when an overcurrent flows through at least one of the conductors 1a and 1b, the overcurrent can be detected regardless of whether or not the oscillation of the oscillator circuit 4 is stopped. Moreover, according to the embodiment, when an overcurrent flows, it is possible to carry out detection of the overcurrent accurately over a wide detection range.

Also, according to the embodiment, no drop due to a difference in core material characteristics occurs in the S/N ratio, as is the case when using two magnetic cores as in a heretofore known example, and it is thus possible to detect a slight current with high accuracy.

Moreover, as it is possible to detect current without using a magnetic sensor, or the like, as in the heretofore known example, it is possible to provide a current detecting device that is robust, and little affected by ambient environmental conditions.

(Embodiment Modification Examples)

(1) In the embodiment, a description has been given of a case wherein the two conductors 1a and 1b are used, and a current that is the difference between the currents flowing through the conductors is detected, but the invention, not being limited to this, can also be applied in a case wherein a slight current flowing through one conductor is detected.

(2) According to the embodiment, the two OR circuits 9a and 9b are used, but these can be replaced with one OR circuit. In this case, the output signal of each of the duty detector circuit 5, oscillation amplitude detector circuit 6, and frequency detector circuit 7 is input into one OR circuit and processed.

(3) In the embodiment, the output signal of each of the duty detector circuit 5, oscillation amplitude detector circuit 6, and frequency detector circuit 7 is used, and provided that, for example, a lamp is illuminated for each signal, it is possible to visually recognize a state wherein an overcurrent is detected, which is convenient.

REFERENCE SIGNS LIST 1a, 1b . . . Conductor, 2 . . . Magnetic core, 3 . . . Exciting coil, 4 . . . Oscillator circuit, 5 . . . Duty detector circuit, 6 . . . Oscillation amplitude detector circuit, 7 . . . Frequency detector circuit, 9a, 9b . . . OR circuit, 51 . . . Duty ratio detector circuit, 52 . . . Comparator circuit, 61 . . . Absolute value detector circuit, 62 . . . Comparator circuit (comparator), 71 . . . High-pass filter circuit, 72 . . . Absolute value detector circuit, 73 . . . Comparator circuit (comparator)

The invention claimed is:

1. A current detecting device for detecting a measurement current flowing through a conductor, comprising:
   an annular magnetic core around the conductor;
   an exciting coil wound around the magnetic core;
   an oscillation means for generating a square wave voltage that causes the magnetism of an exciting current supplied to the exciting coil to invert in accordance with a set threshold value, with the magnetic core in a saturated state or a state in the vicinity thereof;
   a first overcurrent detection means for detecting a first overcurrent indicator of the measurement current based on a variation in the duty ratio of the square wave voltage output from the oscillation means, and for outputting a first overcurrent signal based on detecting the first overcurrent indicator;
   a second overcurrent detection means for detecting a second overcurrent indicator of the measurement current based on the amplitude of the square wave voltage output from the oscillation means, and for outputting a second overcurrent signal based on detecting the second overcurrent indicator;
   a third overcurrent detection means for detecting a third overcurrent indicator of the measurement current based on the frequency of the square wave voltage output from the oscillation means, and for outputting a third overcurrent signal based on detecting the third overcurrent indicator; and
   an output means for generating a first overcurrent detection signal based on the first overcurrent signal, the second overcurrent signal, and the third overcurrent signal.

2. The current detecting device according to claim 1, wherein:
   the first overcurrent detection means detects the variation in the duty ratio of the square wave voltage, and detects the first overcurrent indicator of the measurement current based on the result of the detection,
   the third overcurrent detection means detects a variation in the frequency of the square wave voltage, and detects the third overcurrent indicator of the measurement current based on the result of the detection, and
   the second overcurrent detection means detects a variation in the amplitude of the square wave voltage,
   the output means includes a first logic circuit to generate a second overcurrent detection signal based on the second overcurrent signal and the third overcurrent signal, and a second logic circuit to output the first overcurrent detection signal based on the first overcurrent signal and the second overcurrent detection signal.

3. The current detecting device according to claim 2 wherein the output means is configured to output the first overcurrent detection signal indicating that the measurement current is an overcurrent if the first overcurrent detection means detects the first overcurrent indicator, the second overcurrent detection means detects the second overcurrent indicator, or the third overcurrent detection means detects the third overcurrent indicator.

4. A current detecting device for detecting a measurement current flowing through a conductor, comprising:
an annular magnetic core around the conductor;
an exciting coil wound around the magnetic core;
an oscillation means for generating a square wave voltage that causes the magnetism of an exciting current supplied to the exciting coil to invert in accordance with a set threshold value, with the magnetic core in a saturated state or a state in the vicinity thereof;
a first overcurrent detection means for detecting the duty ratio of the square wave voltage output from the oscillation means, detecting a first overcurrent indicator of the measurement current based on the result of the detection, and generating a first overcurrent signal based on detecting the first overcurrent indicator;
a second overcurrent detection means for detecting variation in the amplitude of the square wave voltage output from the oscillation means, detecting a second overcurrent indicator of the measurement current based on the result of the detection, and generating a second overcurrent signal based on detecting the second overcurrent indicator;
a third overcurrent detection means for detecting a variation in the frequency of the square wave voltage output from the oscillation means, detecting a third overcurrent indicator of the measurement current based on the result of the detection, and generating a third overcurrent signal based on detecting the third overcurrent indicator; and
logic circuitry to output an overcurrent detection signal based on the first overcurrent signal, the second overcurrent signal, and the third overcurrent signal.

5. The current detecting device according to claim 4, wherein the first overcurrent detection means includes:
a duty ratio detector circuit that detects the duty ratio of the square wave voltage output from the oscillation means; and
a comparator circuit that compares the duty ratio detected by the duty ratio detector circuit with a preset reference value, and outputs the first overcurrent signal representing the first overcurrent indicator if the duty ratio is equal to or lower than the reference value.

6. The current detecting device according to claim 4, wherein the third overcurrent detection means includes:
a high-pass filter circuit that carries out a filtering process on the square wave voltage output from the oscillation means;
an absolute value detector circuit that detects the absolute value of the output of the high-pass filter circuit; and
a comparator circuit that compares the absolute value detected by the absolute value detector circuit with a preset first reference value, and outputs the third overcurrent signal representing the third overcurrent indicator if the absolute value is equal to or higher than the first reference value.

7. The current detecting device according to claim 4, wherein the second overcurrent detection means includes:
an absolute value detector circuit that detects the absolute value of the square wave voltage output from the oscillation means; and
a comparator circuit that compares the absolute value detected by the absolute value detector circuit with a preset reference value, and outputs the second overcurrent signal representing the second overcurrent indicator if the absolute value is equal to or lower than the reference value.

8. The current detecting device according to claim 4,
wherein the first overcurrent detection means includes:
a duty ratio detector circuit that detects the duty ratio of the square wave voltage output from the oscillation means, and
a first comparator circuit that compares the duty ratio detected by the duty ratio detector circuit with a preset first reference value, and outputs the first overcurrent signal representing the first overcurrent indicator if the duty ratio is equal to or lower than the reference value;
wherein the second overcurrent detection means includes:
a first absolute value detector circuit that detects the absolute value of the square wave voltage output from the oscillation means, and
a second comparator circuit that compares the absolute value detect by the first absolute value detector circuit with a preset second reference, and outputs the second overcurrent signal representing the second overcurrent indicator if the absolute value is equal to or lower than the second reference value,
wherein the third overcurrent detection means includes:
a high-pass filter circuit that carries out a filtering process on the square wave voltage output from the oscillation means,
a second absolute value detector circuit that detects the absolute value of the output of the high-pass filter circuit, and
a third comparator circuit that compares the absolute value detected by the second absolute value detector circuit with a preset third reference value, and outputs the third overcurrent signal representing the third of overcurrent indicator if the absolute value is equal to or higher than the third reference value, and
wherein the logic circuitry comprises means for OR-ing the output signal of the first comparator circuit, the output signal of the second comparator circuit, and the output signal of the third comparator circuit.

9. The current detecting device according to claim 5, wherein the third overcurrent detection means includes:
a high-pass filter circuit that carries out a filtering process on the square wave voltage output from the oscillation means,
an absolute value detector circuit that detects the absolute value of the output of the high-pass filter circuit, and
a further comparator circuit that compares the absolute value detected by the second absolute value detector circuit with a preset further reference value, and outputs the third overcurrent signal representing the third of overcurrent indicator if the absolute value is equal to or higher than the further reference value.

10. The current detecting device according to claim 9, wherein the second overcurrent detection means includes:
another absolute value detector circuit that detects the absolute value of the square wave voltage output from the oscillation means, and
another comparator circuit that compares the absolute value detect by the another absolute value detector circuit with a preset another reference value, and outputs the second overcurrent signal representing the second overcurrent indicator if the absolute value is equal to or lower than the another reference value.

11. The current detecting device according to claim 5, wherein the second overcurrent detection means includes:
an absolute value detector circuit that detects the absolute value of the square wave voltage output from the oscillation means, and a comparator circuit that compares the absolute value detect by the absolute value detector circuit with a preset reference value, and outputs a signal representing the second overcurrent indicator if the absolute value is equal to or lower than the reference value.

12. The current detecting device according to claim 5, wherein the third overcurrent detection means includes:
a high-pass filter circuit that carries out a filtering process on the square wave voltage output from the oscillation means,
an absolute value detector circuit that detects the absolute value of the output of the high-pass filter circuit, and
a comparator circuit that compares the absolute value detected by the absolute value detector circuit with a preset reference value, and outputs a signal representing the third overcurrent indicator if the absolute value is equal to or higher than the reference value.

* * * * *